(12) United States Patent
Orosel et al.

(10) Patent No.: US 11,608,301 B2
(45) Date of Patent: Mar. 21, 2023

(54) HARD PZT CERAMIC, PIEZOELECTRIC MULTILAYER COMPONENT AND METHOD FOR PRODUCING A PIEZOELECTRIC MULTILAYER COMPONENT

(71) Applicant: TDK Electronics AG, Munich (DE)

(72) Inventors: Denis Orosel, Deutschlandsberg (AT); Markus Puff, Graz (AT); Bernhard Döllgast, Deutschlandsberg (AT); Alexander Glazunov, Deutschlandsberg (AT)

(73) Assignee: TDK ELECTRONICS AG, Munich (DE)

( * ) Notice: Subject to any disclaimer, the term of this patent is extended or adjusted under 35 U.S.C. 154(b) by 596 days.

(21) Appl. No.: 16/621,149

(22) PCT Filed: Jun. 12, 2018

(86) PCT No.: PCT/EP2018/065499
§ 371 (c)(1),
(2) Date: Dec. 10, 2019

(87) PCT Pub. No.: WO2019/020265
PCT Pub. Date: Jan. 31, 2019

(65) Prior Publication Data
US 2020/0131093 A1   Apr. 30, 2020

(30) Foreign Application Priority Data

Jul. 26, 2017 (DE) .......................... 102017116925.3

(51) Int. Cl.
*C04B 35/49* (2006.01)
*H01L 41/18* (2006.01)
(Continued)

(52) U.S. Cl.
CPC .......... *C04B 37/021* (2013.01); *C04B 35/491* (2013.01); *C04B 35/64* (2013.01);
(Continued)

(58) Field of Classification Search
CPC ............. H01L 41/1875; H01L 41/1876; C04B 35/491; C04B 35/493; C04B 35/495; C04B 35/497; C04B 35/499
See application file for complete search history.

(56) References Cited

U.S. PATENT DOCUMENTS 7,605,522 B2   10/2009   Yamamoto et al.
9,780,296 B2   10/2017   Glazunov et al.
(Continued)

FOREIGN PATENT DOCUMENTS

DE       3718486 A1    12/1988
DE   102011117709 A1    5/2013
(Continued)

OTHER PUBLICATIONS

Glinchuk, M. D. et al., "Valency States and Distribution of Manganese Ions in PZT Ceramics Simultaneously Doped with Mn and Nb," phys. stat. sol. (a), vol. 122, May 2, 1990, pp. 341-346.
(Continued)

*Primary Examiner* — Matthew E. Hoban
(74) *Attorney, Agent, or Firm* — Slater Matsil, LLP

(57) ABSTRACT

A hard lead zirconate titanate (PZT) ceramic has an $ABO_3$ structure with A sites and B sites. The PZT ceramic is doped with Mn and with Nb on the B sites and the ratio Nb/Mn is <2. A piezoelectric multilayer component having such a PZT ceramic and also a method for producing a piezoelectric multilayer component are also disclosed.

11 Claims, 1 Drawing Sheet

(51) Int. Cl.
  *C04B 37/02* (2006.01)
  *C04B 35/491* (2006.01)
  *C04B 35/64* (2006.01)
  *H01L 41/107* (2006.01)
  *H01L 41/187* (2006.01)
  *H01L 41/273* (2013.01)

(52) U.S. Cl.
  CPC ........ *H01L 41/107* (2013.01); *H01L 41/1876* (2013.01); *H01L 41/273* (2013.01); *C04B 2235/3201* (2013.01); *C04B 2235/3234* (2013.01); *C04B 2235/3255* (2013.01); *C04B 2235/3262* (2013.01); *C04B 2235/3281* (2013.01); *C04B 2235/3296* (2013.01); *C04B 2235/656* (2013.01); *C04B 2235/768* (2013.01); *C04B 2237/348* (2013.01); *C04B 2237/407* (2013.01)

(56) References Cited

U.S. PATENT DOCUMENTS

| | | | |
|---|---|---|---|
| 2002/0041132 A1* | 4/2002 | Yoshizawa | C04B 35/493 310/358 |
| 2006/0145571 A1 | 7/2006 | Glazunov | |
| 2006/0229187 A1 | 10/2006 | Liufu | |
| 2008/0074004 A1* | 3/2008 | Yamamoto | H01L 41/273 310/358 |
| 2011/0006639 A1 | 1/2011 | Kashiwaya et al. | |
| 2015/0373824 A1 | 12/2015 | Nettesheim et al. | |
| 2017/0001912 A1 | 1/2017 | Doi et al. | |
| 2017/0129815 A1 | 5/2017 | Dio et al. | |
| 2018/0249569 A1 | 8/2018 | Weilguni et al. | |
| 2019/0140162 A1 | 5/2019 | Orosel et al. | |

FOREIGN PATENT DOCUMENTS

| | | |
|---|---|---|
| DE | 102015113656 A1 | 2/2017 |
| EP | 1702905 A1 | 9/2006 |
| EP | 2267808 A1 | 12/2010 |
| JP | 2002255644 A | 9/2002 |
| JP | 2004203629 A | 7/2004 |
| JP | 2010215418 A | 9/2010 |
| JP | 2010258199 A | 11/2010 |
| JP | 2016510483 A | 4/2016 |
| WO | 2004032255 A2 | 4/2004 |
| WO | 2006110722 A1 | 10/2006 |
| WO | 2017182263 A1 | 10/2017 |

OTHER PUBLICATIONS

Lee, Hyeung Gyu et al.; "Dielectric and Piezoelectric Properties of Pb(Zr½Ti½)O3—Pb(Cu⅓Nb⅔)O3—Pb(Mn⅓Nb⅔)O3 System," Journal of the Korean Ceramic Society, vol. 42, No. 10, Oct. 14, 2005, pp. 698-702.

* cited by examiner

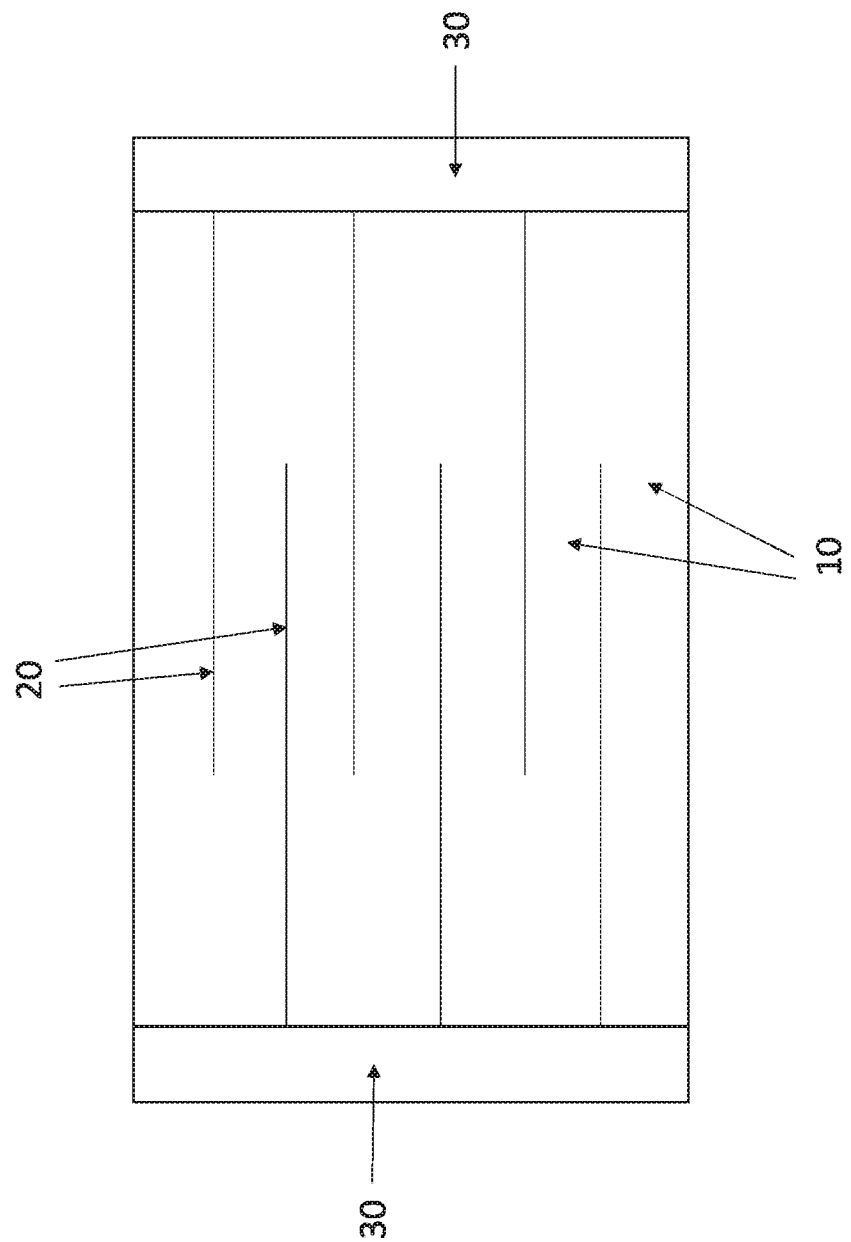

HARD PZT CERAMIC, PIEZOELECTRIC MULTILAYER COMPONENT AND METHOD FOR PRODUCING A PIEZOELECTRIC MULTILAYER COMPONENT

This patent application is a national phase filing under section 371 of PCT/EP2018/065499, filed Jun. 12, 2018, which claims the priority of German patent application 102017116925.3, filed Jul. 26, 2017, each of which is incorporated herein by reference in its entirety.

TECHNICAL FIELD

A hard lead zirconate titanate (PZT) ceramic, a piezoelectric multilayer component and a method for producing a piezoelectric multilayer component are disclosed.

BACKGROUND

PZT ceramics, which have piezoelectric properties, withstand high electrical and mechanical loadings. Hard PZT ceramics can be used, in particular, for resonance applications, for example in the form of piezoelectric transformers. For use of PZT material systems in piezoelectric transformers, it is important that the materials properties are maintained during sintering and the geometry of the components is ensured.

SUMMARY

At least one embodiment provides a hard PZT ceramic having improved properties. Further objects are the provision of a piezoelectric multilayer component comprising the PZT ceramic and also a method for producing a piezoelectric multilayer component.

In one embodiment, a hard lead zirconate titanate (PZT) ceramic has an $ABO_3$ structure comprising A sites and B sites. The PZT ceramic is doped with Mn and Nb on the B sites and the ratio Nb/Mn is <2, is provided.

Other embodiments and variations are disclosed herein.

BRIEF DESCRIPTION OF THE DRAWINGS

The sole FIGURE shows a schematic sectional view of a piezoelectric multilayer component.

DETAILED DESCRIPTION OF ILLUSTRATIVE EMBODIMENTS

Embodiments of the invention will now be described.

In one embodiment, a hard lead zirconate titanate (PZT) ceramic has an $ABO_3$ structure comprising A sites and B sites. The PZT ceramic is doped with Mn and Nb on the B sites and the ratio Nb/Mn is <2, is provided.

Here and in the following, a PZT ceramic is to be understood as a ceramic which is based on the system $Pb(Zr_xTi_{1-x})O_3$. Such a system has an $ABO_3$ structure in which, for the pure lead zirconate titanate Pb occupies the A site and $(Zr_xTi_{1-x})$ occupies the B site. If further elements are present in the ceramic, these are referred to as dopants which can be present on the A sites and/or on the B sites. The formula $ABO_3$ describes the crystal structure of the PZT ceramic, wherein A in the basic composition is divalent and B is tetravalent.

The term "hard" PZT ceramic is employed when the basic composition $Pb(Zr_xT_{1-x})O_3$ is doped with acceptors. Acceptors are in this case cations having a lower valency than the corresponding lattice atoms on the A and B sites. Hard PZT ceramics can have low mechanical losses ($Q_m$=1000 to 2000) and dielectric losses (tan δ=0.3% to 0.4%), respectively.

A PZT ceramic which is doped with Mn and Nb on the B sites and the ratio Nb/Mn is <2 can be received by its production without significant degradation of the hard piezoelectric properties during sintering. Thus, retention of the materials properties of the hard PZT ceramic and also the geometry of the components containing the PZT ceramic are ensured. In addition, the PZT ceramic has comparable hard piezoelectric properties over a wide formulation range and for this reason process fluctuations in the production of a pulverulent starting mixture for producing the PZT ceramic have virtually no effects on a piezoelectric component containing the PZT ceramic.

According to one embodiment, it applies 1.4≤Nb/Mn<2, in particular 1.45≤Nb/Mn<1.9. No significant degradation of the hard piezoelectric properties during sintering can be observed at this ratio of Nb to Mn.

According to one embodiment, the PZT ceramic has the general formula $$(Pb_{xPb}A_{xA})_{1-y}(Zr_{xZr}Ti_{xTi}Mn_{(1+z)/3}Nb_{(2-z)/3}B_{xB})_yO_3.$$

Here, $A_{xA}$ encompasses the doping elements $A1_{xA1}$ to $Aa_{xAa}$, where a is the number of doping elements on the A sites and a≥1. Furthermore, $B_{xB}$ encompasses the doping elements $B1_{xB1}$ to $Bb_{xBb}$, where b is the number of doping elements on the B sites and b≥1. This means that for a=1, $A_{xA}=A1_{xA1}$, and for b=1, $B_{xB}=B1_{xB1}$ and there is therefore in each case only one doping element on the A site and only one doping element apart from Mn and Nb on the B site. For a>1 or b>1, doping elements A1, A2 and so forth up to Aa and B1, B2 and so forth up to Bb, respectively, are present on the respective sites. a can, for example, be 2, and b can likewise be, for example, 2.

A1 to Aa are, independently of one another, selected from a group comprising Na, K, Nd, La, Ba, Sr, Ca, Bi and Ag. B1 to Bb are, independently of one another, selected from a group comprising Fe, Zn, Ge, Sn, Al, Ga, Sb and Cu. For example, the A sites can be doped with Na and/or K. The B sites can, in particular, be doped with Cu.

"x" in the above formula indicates the proportion of the respective element, i.e., doping element. Furthermore, 0.9≤xZr/xTi≤1.2, 0.4≤y≤0.6, 0.0001≤xA≤0.05 applies for each A1 to Aa, 0.00010≤xB≤0.05 applies for each B1 to Bb and 0<z≤0.25. xZr/xTi can, in particular, be equal to 1, and y can, in particular, be equal to 0.5.

According to a further embodiment, xMn=(1+z)/3 and xNb=(2−z)/3 and it applies:

$$xZr + xTi + xMn + xNb + \sum_{n=1}^{b} xBn = 1.$$

This means that all possible B sites are occupied. Furthermore, the following applies:

$$xZr + xTi + xMn + xNb + \sum_{n=1}^{b} xBn = xPb + \sum_{n=1}^{a} xAn.$$

This means that all A sites and all B sites are occupied. If these equations are satisfied, i.e., all possible A sites and B sites are occupied, the PZT ceramic or a component containing the PZT ceramic has particularly good hard piezoelectric properties and a good sinterability.

Furthermore, a piezoelectric multilayer component which comprises a stack of ceramic layers and at least two electrodes arranged between ceramic layers is disclosed. The ceramic layers contain a hard PZT ceramic as described above. This means that all properties disclosed in respect of the PZT ceramic also apply to the multilayer component and vice versa.

The piezoelectric multilayer component can have a monolithic structure. The ceramic layers are arranged on top of one another. As a result of the ceramic layers containing a PZT ceramic as described above, the multilayer component has a high dimensional accuracy and uniform deflection behavior.

According to one embodiment, the at least two electrodes contain elemental copper. In particular, the at least two electrodes can consist of elemental copper. They can thus also be referred to as internal copper electrodes. Copper is an advantageous electrode material which can contribute to the inexpensive production of such a multilayer component.

According to one embodiment, the piezoelectric multilayer component is a piezoelectric transformer. The piezoelectric transformer can be, in particular, a plasma generator.

Furthermore, a method for producing a piezoelectric multilayer component as described above is disclosed. The method comprises the steps: production of a pulverulent starting mixture in the stoichiometric ratio containing starting materials which comprise oxides and/or carbonates of Pb, Zr, Ti, Mn, Nb, at least one from the group Na, K, Nd, La, Ba, Sr, Ca, Bi and Ag and at least one from the group Fe, Zn, Ge, Sn, Al, Ga, Sb and Cu, production of green sheets from the starting mixture, alternate stacking of green sheets and electrode layers and sintering of the stack. All features disclosed in respect of the multilayer component also apply to the method and vice versa.

The starting materials are, in one embodiment, present in powder form, are mixed and milled to produce the starting mixture. The green sheets are produced by preparing the pulverulent starting mixture and milling it again and heat treating it. The green sheets are stacked on top of one another in such a way that electrode layers are arranged between two green sheets. As electrode layers, it is possible to use, in particular, copper electrodes.

According to one embodiment, sintering is carried out at a temperature selected from the range from 900° C. to 1000° C. inclusive, in particular from the range from 950° C. to 1000° C. A PZT ceramic with a high density can be produced in this way which has a low dielectric loss and a high electromechanical coupling efficiency.

Sintering can, according to one embodiment, be carried out in an inert gas atmosphere. Furthermore, sintering can also be carried out under reducing conditions.

Owing to the abovementioned advantageous properties of the PZT ceramic, a multilayer component whose geometry is maintained during sintering and whose piezoelectric materials properties are retained during sintering can be produced by the method.

Embodiments of the invention will now be described in more detail with the aid of the FIGURE and examples.

In the FIGURE, identical constituents or constituents having the same effect are in each case provided with the same references. The elements depicted are not to be regarded as true to scale; rather, individual elements can be depicted disproportionately large in the interests of better understanding.

FIG. 1 shows the schematic sectional view of a piezoelectric multilayer component. This contains ceramic layers 10 which are stacked on top of one another. Between two ceramic layers 10, there are electrodes 20, for example internal copper electrodes, which are contacted via external electrodes 30. The multilayer component is a monolithic multilayer component. This can be used as piezoelectric transformer. In particular, it can be a plasma generator.

The ceramic layers 10 contain a hard PZT ceramic which has an $ABO_3$ structure and is doped with Mn and Nb on the B sites. The ratio Nb/Mn is <2. In particular, the PZT ceramic can have the general formula $(Pb_{xPb}A_{xA})_{1-y}(Zr_{xZr}Ti_{xTi}Mn_{(i+z)/3}Nb_{(2-z)/3}B_{xB})_yO_3$. Here, $0<z\leq0.25$, as a result of which the ratio Nb/Mn is <2. A can, for example, be Na, and B can, for example, be Cu. All doping elements mentioned above in relation to the general formula on the A sites and B sites are likewise possible. It is advantageous for all A sites and all B sites to be occupied.

Four exemplary embodiments M1 to M4 of PZT ceramics are provided below whose intended values as per amount weighed out for the ratio Nb/Mn are 1.79 (M1), 1.61 (M2), 1.45 (M3) and 1.9 (M4). The compositions of the powders determined by means of XFA measurement (XFA=X-ray frequency analysis) and Nb/Mn ratios derived therefrom are reported in Table 1.

TABLE 1

| | PbO (mol %) | TiO$_2$ (mol %) | ZrO$_2$ (mol %) | Nb$_2$O$_5$ (mol %) | MnO (mol %) | Na$_2$O (mol %) | CuO (mol %) | Nb/Mn |
|---|---|---|---|---|---|---|---|---|
| M1 | 99.346 | 44.226 | 46.570 | 5.190 | 2.869 | 0.749 | 0.365 | 1.81 |
| M2 | 99.492 | 44.231 | 46.395 | 5.008 | 3.048 | 0.748 | 0.367 | 1.64 |
| M3 | 99.554 | 44.128 | 46.436 | 4.829 | 3.226 | 0.751 | 0.366 | 1.50 |
| M4 | 99.479 | 44.056 | 46.379 | 5.294 | 2.777 | 0.756 | 0.365 | 1.91 |

Measured electrical data for disk specimens (diameter: 12 mm, height: 1 mm) produced from the above-described powders compared to a comparative specimen (V) having a ratio Nb/Mn of 2 to accompany these exemplary embodiments are reported in Table 2.

TABLE 2

| | $Q_m[-]$ | $\varepsilon_{33}[-]$ | $k_p[-]$ | $d_{33}[pc/N]$ | Nb/Mn |
|---|---|---|---|---|---|
| M$_1$ | 1594 | 530 | 0.53 | 178 | 1.81 |
| M$_2$ | 1684 | 516 | 0.52 | 182 | 1.64 |
| M$_3$ | 1545 | 530 | 0.53 | 180 | 1.50 |
| M$_4$ | 1561 | 570 | 0.51 | 205 | 1.91 |
| V | 1929 | 615 | 0.55 | 229 | 2 |

Good hard piezoelectric properties of examples M1 to M4 can be seen from table 2. The mechanical loss $Q_m$, the relative permittivity $E_{33}$, the coupling factor $k_p$ and $d_{33}$ are in acceptable ranges for use in components such as piezoelectric transformers or plasma generators.

The invention is not restricted by the figures and exemplary embodiments. Rather, the invention encompasses every new feature and any combination of features which, in particular, comprises any combination of features in the claims even if this feature or this combination itself is not explicitly indicated in the claims or exemplary embodiments.

The invention claimed is:

1. A hard lead zirconate titanate (PZT) ceramic comprising:

an $ABO_3$ structure comprising A sites and B sites, wherein the PZT ceramic is doped with Mn and with Nb on the B sites and a ratio Nb/Mn is <2, wherein the PZT ceramic has the general formula:

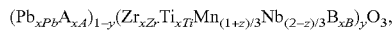

wherein $A_{xA}$ encompasses doping elements $A1_{xA1}$ to $Aa_{xAa}$, a being a number of the doping elements on the A sites and a≥1, wherein $B_{xB}$ encompasses doping elements $B1_{xB1}$ to $Bb_{xBb}$, b being a number of the doping elements on the B sites and b≥1, wherein A1 to Aa comprise, independently of one another, an element selected from the group consisting of Na and K, wherein B1 to Bb is Cu, wherein x is a proportion of a respective element, and wherein 0.9≤xZr/xTi≤1.2, 0.4≤y≤0.6, 0.0001≤xA≤0.05 for each A1 to Aa, 0.0001≤xB≤0.05 for each B1 to Bb, and 0<z≤0.25.

2. A piezoelectric multilayer component comprising:

a stack of ceramic layers; and a plurality of electrodes arranged between ceramic layers, wherein each ceramic layer contains a hard PZT ceramic having an ABO$_3$ structure comprising A sites and B sites, wherein the PZT ceramic is doped with Mn and with Nb on the B sites and a ratio Nb/Mn is <2, wherein the PZT ceramic has the general formula:

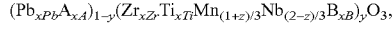

wherein $A_{xA}$ encompasses doping elements $A1_{xA1}$ to $Aa_{xAa}$, a being a number of the doping elements on the A sites and a≥1, wherein $B_{xB}$ encompasses doping elements $B1_{xB1}$ to $Bb_{xBb}$, b being a number of the doping elements on the B sites and b≥1, wherein A1 to Aa comprise, independently of one another, an element selected from the group consisting of Na and K, wherein B1 to Bb is Cu, wherein x is a proportion of a respective element, and wherein 0.9≤xZr/xTi≤1.2, 0.4≤y≤0.6, 0.0001≤xA≤0.05 for each A1 to Aa, 0.0001≤xB≤0.05 for each B1 to Bb, and 0<z≤0.25.

3. The multilayer component according to claim 2, wherein the electrodes contain elemental copper.

4. The multilayer component according to claim 2, wherein the multilayer component is a piezoelectric transformer.

5. The multilayer component according to claim 4, wherein the piezoelectric transformer is a plasma generator.

6. A method for producing a piezoelectric multilayer component, the method comprising:

providing a starting mixture;

producing green sheets from the starting mixture;

alternately stacking the green sheets and electrode layers to form a stack; and sintering the stack to form a structure comprising a plurality of electrodes arranged between ceramic layers, wherein each ceramic layer contains a hard PZT ceramic having an ABO$_3$ structure comprising A sites and B sites, wherein the PZT ceramic is doped with Mn and with Nb on the B sites and a ratio Nb/Mn is <2, wherein the PZT ceramic has the general formula:

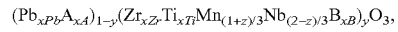

wherein $A_{xA}$ encompasses doping elements $A1_{xA1}$ to $Aa_{xAa}$, a being a number of the doping elements on the A sites and a≥1, wherein $B_{xB}$ encompasses doping elements $B1_{xB1}$ to $Bb_{xBb}$, b being a number of the doping elements on the B sites and b≥1, wherein A1 to Aa comprise, independently of one another, an element selected from the group consisting of Na and K, wherein B1 to Bb is Cu, wherein x is a proportion of a respective element, and wherein 0.9≤xZr/xTi≤1.2, 0.4≤y≤0.6, 0.0001≤xA≤0.05 for each A1 to Aa, 0.0001≤xB≤0.05 for each B1 to Bb, and 0<z≤0.25.

7. The method of claim 6, wherein providing the starting mixture comprises producing a pulverulent starting mixture in a stoichiometric ratio containing starting materials which comprise oxides and/or carbonates of Pb, Zr, Ti, Mn, Nb, at least one element selected from the group consisting of Na and K, and Cu.

8. The method according to claim 7, wherein sintering is carried out at a temperature in a range from 900° C. to 1000° C.

9. The method according to claim 8, wherein sintering is carried out in an inert gas atmosphere.

10. The method according to claim 7, wherein sintering is carried out in an inert gas atmosphere.

11. The method according to claim 7, wherein the electrodes contain elemental copper.

* * * * *